(12) United States Patent
Kim

(10) Patent No.: US 8,476,661 B2
(45) Date of Patent: Jul. 2, 2013

(54) LIGHT EMITTING ELEMENT

(75) Inventor: Eu Gene Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 150 days.

(21) Appl. No.: 12/947,194

(22) Filed: Nov. 16, 2010

(65) Prior Publication Data

US 2012/0056221 A1    Mar. 8, 2012

(30) Foreign Application Priority Data

Sep. 6, 2010  (KR) .................. 10-2010-0086802

(51) Int. Cl.
*H01L 33/00* (2010.01)
(52) U.S. Cl.
USPC .......................................... 257/98
(58) Field of Classification Search
USPC .................................... 257/95, 98
See application file for complete search history.

(56) References Cited

U.S. PATENT DOCUMENTS

| | | | |
|---|---|---|---|
| 7,717,589 B2* | 5/2010 | Nishioka et al. ............ 362/293 |
| 7,943,952 B2* | 5/2011 | Loh et al. .................. 257/100 |
| 8,106,418 B2* | 1/2012 | Bando ....................... 257/99 |
| 2001/0015443 A1* | 8/2001 | Komoto ...................... 257/81 |
| 2001/0028053 A1* | 10/2001 | Hohn et al. .............. 252/301.36 |
| 2002/0079506 A1* | 6/2002 | Komoto et al. ............. 257/99 |
| 2002/0190262 A1* | 12/2002 | Nitta et al. ................ 257/99 |
| 2004/0104391 A1* | 6/2004 | Maeda et al. ............... 257/79 |
| 2005/0077532 A1* | 4/2005 | Ota et al. .................. 257/98 |
| 2007/0085103 A1* | 4/2007 | Nishioka et al. ............ 257/99 |
| 2007/0205425 A1* | 9/2007 | Harada ..................... 257/98 |
| 2007/0262336 A1* | 11/2007 | Tamaki et al. .............. 257/98 |
| 2007/0267645 A1* | 11/2007 | Nakata et al. .............. 257/98 |
| 2008/0079017 A1* | 4/2008 | Loh et al. .................. 257/98 |
| 2008/0135862 A1* | 6/2008 | Maeda et al. ............... 257/98 |
| 2008/0149960 A1* | 6/2008 | Amo et al. ................. 257/98 |
| 2008/0179609 A1* | 7/2008 | Trottier et al. ............. 257/98 |
| 2008/0191232 A1* | 8/2008 | Lee et al. .................. 257/98 |
| 2008/0191237 A1* | 8/2008 | Andrews ................... 257/100 |
| 2008/0315227 A1* | 12/2008 | Bogner et al. .............. 257/98 |
| 2009/0008673 A1* | 1/2009 | Kato et al. ................. 257/100 |
| 2009/0026485 A1* | 1/2009 | Urano et al. ............... 257/99 |
| 2009/0045420 A1* | 2/2009 | Eng et al. .................. 257/98 |
| 2009/0045422 A1* | 2/2009 | Kato et al. ................. 257/98 |
| 2009/0173958 A1* | 7/2009 | Chakraborty et al. ........ 257/98 |
| 2009/0200567 A1* | 8/2009 | Yoon ....................... 257/98 |
| 2009/0200570 A1* | 8/2009 | Mori et al. ................ 257/99 |
| 2009/0224273 A1* | 9/2009 | Sakamoto et al. ........... 257/98 |
| 2009/0242906 A1* | 10/2009 | Tsukagoshi ................ 257/88 |
| 2009/0267085 A1* | 10/2009 | Lee et al. .................. 257/88 |
| 2009/0267099 A1* | 10/2009 | Sakai ...................... 257/98 |
| 2009/0309116 A1* | 12/2009 | Kato et al. ................. 257/98 |
| 2010/0019265 A1* | 1/2010 | Sormani et al. ............. 257/98 |
| 2010/0133568 A1* | 6/2010 | Komatsu et al. ............ 257/98 |
| 2011/0012141 A1* | 1/2011 | Le Toquin et al. .......... 257/89 |
| 2011/0062470 A1* | 3/2011 | Bierhuizen et al. .......... 257/98 |

(Continued)

*Primary Examiner* — Jae Lee
*Assistant Examiner* — Grant Withers
(74) *Attorney, Agent, or Firm* — H.C. Park & Associates, PLC

(57) ABSTRACT

The present invention provides a light emitting element, which includes a light emitting diode (LED) chip and a wavelength-converting layer arranged on a surface of the LED chip, the wavelength-converting layer to convert a wavelength of light emitted from the LED chip, wherein at least a portion of the wavelength-converting layer has a width greater than the width of the surface of the LED chip.

13 Claims, 3 Drawing Sheets

U.S. PATENT DOCUMENTS

| | | | |
|---|---|---|---|
| 2011/0121321 A1* | 5/2011 | Kato et al. | 257/79 |
| 2011/0175128 A1* | 7/2011 | Lee et al. | 257/98 |
| 2011/0303935 A1* | 12/2011 | Chern | 257/98 |
| 2012/0025216 A1* | 2/2012 | Kolodin et al. | 257/88 |
| 2012/0025218 A1* | 2/2012 | Ito et al. | 257/88 |
| 2012/0074448 A1* | 3/2012 | Wierer et al. | 257/98 |
| 2012/0119237 A1* | 5/2012 | Leatherdale et al. | 257/88 |

* cited by examiner (a)

(b)

(a)

(b)

LIGHT EMITTING ELEMENT

This application claims priority from and the benefit of Korean Patent Application No. 2010-0086802, filed on Sep. 6, 2010, which is hereby incorporated by reference for all purposes as if fully set forth herein.

BACKGROUND OF THE INVENTION

1. Field of the Invention

The present invention relates to a light emitting element, and more particularly, to a light emitting element including a wavelength-converting layer arranged on an upper surface of a light emitting diode (LED) chip. The wavelength-converting layer may reduce a color variation generated between a vertical surface and a side of the LED chip.

2. Discussion of the Background

Methods for realizing a white light source using LEDs may be classified into: a method for combining an LED chip emitting blue light and a yellow phosphor; a method for combining an LED chip emitting blue light, an LED chip emitting red light and an LED chip emitting green light without any combination of phosphors; and a method for combining an ultraviolet (UV) LED chip emitting ultraviolet rays and red, green and blue phosphors. Among these methods, the combination of an LED chip emitting blue light and a yellow phosphor has been generally widely used.

When combining an LED chip emitting blue light with a yellow phosphor, the yellow phosphor may be dotted onto the LED chip in a dispensing or piezo manner, or a conformal coating method may also be used. The conformal coating method may adopt electrophoresis, spraying, attachment of a wavelength-converting sheet, or the like.

Among the conformal coating methods, the method of attaching a wavelength-converting sheet may allow uniform emission of light with a desired wavelength when the wavelength-converting sheet has the same area as the upper surface of the LED chip. However, if the area of the wavelength-converting sheet is smaller or greater than the area of the upper surface of the LED chip, certain problems may occur. In a case where the area of the surface of the wavelength-converting sheet contacting the upper surface of the LED chip is smaller than the area of the upper surface of the LED chip, the light output from the LED chip may be partially emitted without wavelength conversion, which results in irregular distribution of white light and occurrence of a blue ring. On the other hand, in a case where the area of the surface of the wavelength-converting sheet contacting the upper surface of the LED chip is greater than the area of the upper surface of the LED chip, the wavelength-converting sheet may move in a predetermined direction due to fluidity of an adhesive material for attaching the wavelength-converting sheet to the LED chip, so that the light output from the LED chip may be partially emitted without wavelength conversion.

SUMMARY OF THE INVENTION

Exemplary embodiments of the present invention provide a light emitting element including a wavelength-converting layer arranged on an LED chip. The wavelength-converting layer may reduce a color variation generated between a vertical surface and a side of the LED chip. The wavelength-converting layer may be arranged on an upper surface of the LED chip and uniformly color-convert the light emitted from the LED chip.

Additional features of the invention will be set forth in the description which follows, and in part will be apparent from the description, or may be learned by practice of the invention Exemplary embodiments of the present invention also provide a light emitting element, which includes an LED chip and a wavelength-converting layer arranged on a surface of the LED chip, the wavelength-converting layer to convert a wavelength of light emitted from the LED chip, wherein at least a portion of the wavelength-converting layer has a width greater than the width of the surface of the LED chip.

Exemplary embodiments of the present invention also provided a light emitting element package, which includes a first lead frame and a second lead frame spaced apart from each other, and a light emitting element arranged on at least one of the lead frames, wherein the light emitting element includes an LED chip and a wavelength-converting layer arranged on a surface of the LED chip, the wavelength-converting layer to convert a wavelength of light emitted from the LED chip, wherein at least a portion of the wavelength-converting layer has a width greater than the width of the surface of the LED chip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
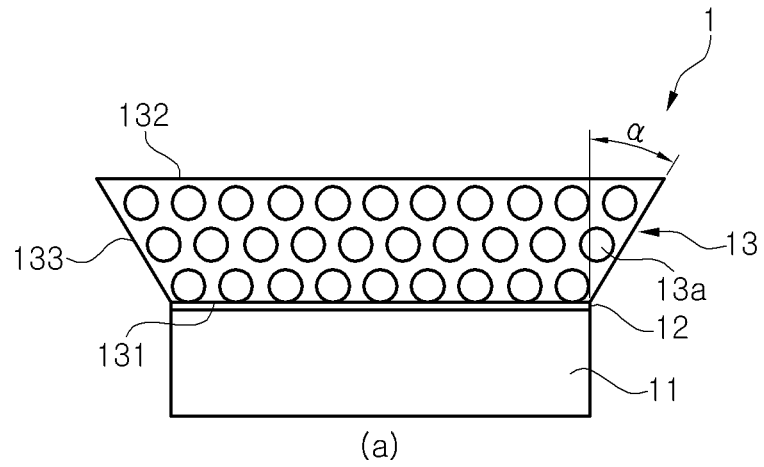
FIG. 1a and FIG. 1b show a light emitting element according to an exemplary embodiment of the present invention.
Figure 1:
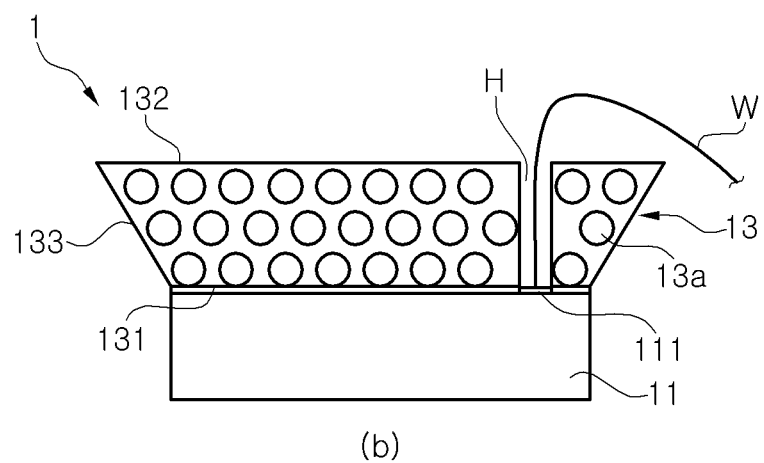

Hereinafter, exemplary embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 shows a light emitting element according to an exemplary embodiment of the present invention, wherein FIG. 1(a) is a schematic view illustrating a wavelength-converting layer and FIG. 1(b) shows a wire bonded to the light emitting element through the wavelength-converting layer shown in FIG. 1(a).

Referring to FIG. 1(a), a light emitting element 1 includes an LED chip 11, an adhesive layer 12 and a wavelength-converting layer 13. The LED chip 11 may be a lateral type LED chip that has both n-type and p-type electrodes on an upper portion thereof, or a vertical type LED chip that has an n-type electrode and a p-type electrode opposite to each other in a vertical direction. Also, the LED chip 11 may comprise any kind of LED chip that generates light at a boundary, layer or region between an n-type compound semiconductor layer and a p-type compound semiconductor layer and then emits the light through either compound semiconductor layer. Hereinafter, it will be explained that the LED chip 11 emits light from the upper surface of the LED chip 11. Although the adhesive layer 12 includes silicon in the present exemplary embodiment, it is not limited thereto, and any material capable of attaching the wavelength-converting layer 13 to the upper surface of the LED chip 11 may be used. When the adhesive layer 12 is made of silicon, the silicon may be spread over the entire upper surface of the LED chip 11, so that the wavelength-converting layer 13 may be fixed to the entire surface of the LED chip 11 in a subsequent curing process. The fluidity of the silicon may improve its spreading over the entire upper surface of the LED chip 11.

The wavelength-converting layer 13 may be formed into a sheet containing a wavelength-converting material 13a. The wavelength-converting layer 13 may be molded in advance before it is attached to the LED chip 11, and as shown in FIG. 1(b), the wavelength-converting layer 13 may further have a hole H through which a bonding pad 111 for bonding a wire W is exposed. The bonding pad 111 is formed on the upper portion of the LED chip 11 before the wavelength-converting layer 13 is formed on the upper surface of the LED chip 11, and the LED chip 11 is electrically connected to the wire W via the bonding pad 111.

The wavelength-converting layer 13 according to the present exemplary embodiment includes a first surface 131 adhering to the upper surface of the LED chip 11 through the adhesive layer 12, a second surface 132 corresponding to and substantially parallel to the upper surface of the LED chip 11, and a third surface 133 connecting the first surface 131 and the second surface 132. Generally, in a case where the adhesive layer 12 is a material with fluidity, if the area of the first surface 131 is greater than the area of the upper surface of the LED chip 11, the first surface 131 may be biased to a certain direction. Thus, the first surface 131 may be formed to have an area equal to or smaller than the upper surface of the LED chip 11.

Although the second surface 132 may be substantially parallel to the upper surface of the LED chip 11, the present invention is not limited thereto, and the second surface 132 may be curved. In a case where the second surface 132 has a curve, the wavelength-converting layer 13 may serve as a lens. The second surface 132 may extend in one side direction and the other side direction of the first surface 131 to have a width greater than that of the first surface 131. The second surface 132 may have a width at least equal to the maximum light emitting width of the LED chip 11.

The wavelength-converting layer 13 may convert the wavelength of light emitted from the side of the LED chip 11. Accordingly, both light emitted from the upper surface of the LED chip 11 and light emitted from the side of the LED chip 11 may pass through the wavelength-converting layer 13. Therefore, the wavelength-converting layer 13 may allow implementation of a uniform white light source. In other words, as an example, among blue light emitted from the upper surface of the LED chip 11, the blue light that does not reach the first surface 131 and thus is not converted into white light may be converted into white light by passing through the second surface 132 of the wavelength-converting layer 13, if the second surface 132 is sufficiently wide. The wavelength-converting layer 13 may contain yellow phosphors, but is not limited thereto, and may include a wavelength converter or mixture of wavelength converters.

According to the present exemplary embodiment, the third surface 133 has a slope with a predetermined angle α with respect to the side of the LED chip 11, where α is measured as the angle from a line extending from the upper corner of the LED chip to an outermost point of the wavelength converting layer. Here, the third surface 133 may have an angle of 80° or less with respect to the side of the LED chip 11 as a reference surface, so that the width of the second surface 132 is greater than the width of the first surface 131 by a predetermined width. Though FIG. 1 shows that the third surface 133 connects the first surface 131 and the second surface 132 in a straight line, the present invention is not limited thereto, and a predetermined step or notch may be formed between the first surface 131 and the second surface 132. A more detailed explanation thereof will be made with reference to FIG. 2, FIG. 3, FIG. 4, and FIG. 5.

Figure 2:
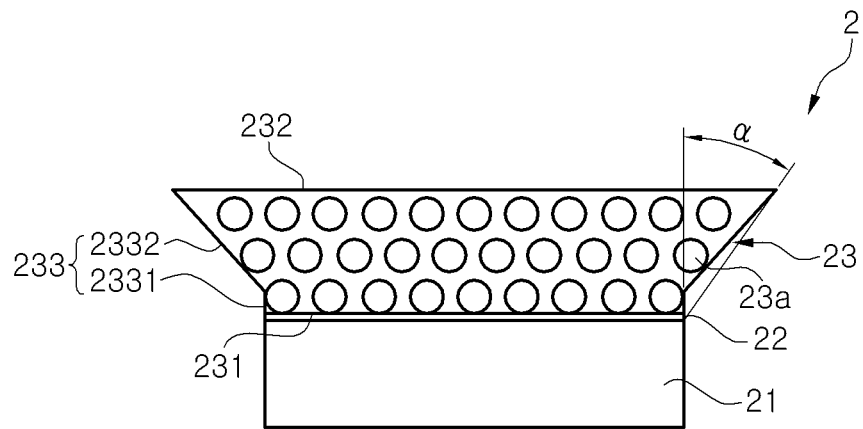
FIG. 2, FIG. 3, FIG. 4, FIG. 5, and FIG. 6 show modifications of a wavelength-converting layer shown in FIG. 1.

Referring to FIG. 2, the wavelength-converting layer 23 includes a third surface 233, which has a different shape from the aforementioned third surface 133, between a first surface 231 and a second surface 232. The third surface 233 includes a fourth surface 2331 bounding a portion of the wavelength-converting layer 23 having the same width as the first surface 231 and located on an upper surface of an LED chip 21, and a fifth surface 2332 connecting the fourth surface 2331 and the second surface 232. The fifth surface 2332 may be inclined at a predetermined angle.

Figure 3:
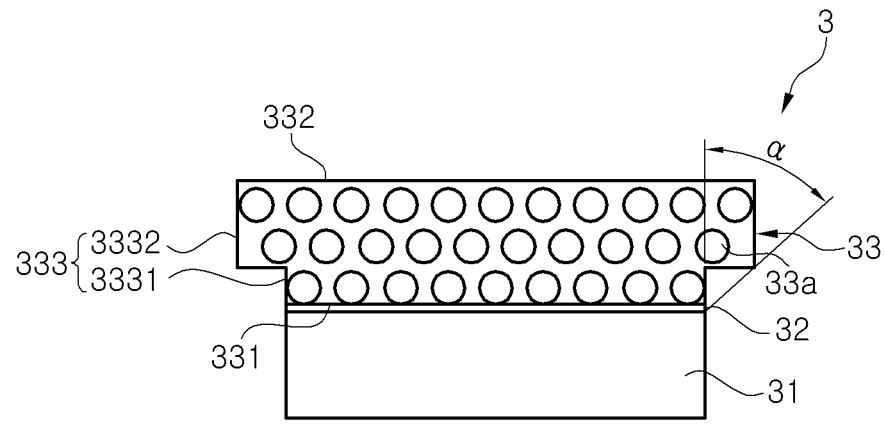

As shown in FIG. 3, a fifth surface 3332 is substantially perpendicularly connected to a second surface 332, and the second surface 332 extends in a first side direction and a second side direction of a first surface 331 so that the second surface 332 has a width greater than a portion of the wavelength-converting layer 32 bound by the fourth surface 3331.

Figure 4:
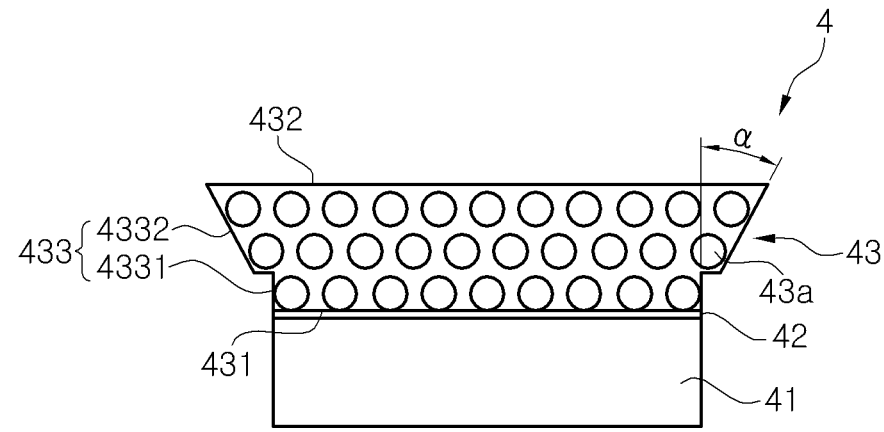

As shown in FIG. 4, a fifth surface 4332 has a predetermined slope with respect to a second surface 432, and may be sloped towards the upper surface of an LED chip 41. Here, the fifth surface 4332 may allow the second surface 432 to extend to a width greater than that of the second surface 332 shown in FIG. 3.

Figure 5:
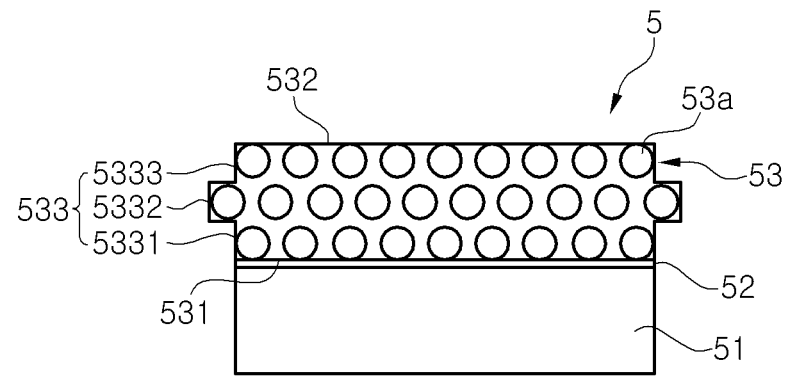

A wavelength-converting layer 53 shown in FIG. 5 includes a second surface 532 having substantially the same width as a first surface 531 attached to the upper surface of an LED chip 51, and a third surface 533 connecting the first surface 531 and the second surface 532 and including portion having a width greater than the width of the first surface 531. Here, the second surface 532 may alternatively have a width greater or smaller than the width of the first surface 531.

The third surface 533 includes a sixth surface 5331 bounding a portion of the wavelength-converting layer 53 having the same width as the first surface 531, a seventh surface 5332 bounding a portion of the wavelength-converting layer 53 having a width greater than the portion of the wavelength-converting layer 53 bound by the sixth surface 5331, and an eighth surface 5333 connecting the portion of the wavelength-converting layer 53 bound by the seventh surface 5332 and the second surface 532. Here, the portion of the wavelength-converting layer 53 bound by the seventh surface 5332 may be formed to have a greater width by a predetermined amount in a first side direction and a second side direction of the first surface 531, and the portion of the wavelength-converting layer 53 bound by the eighth surface 5333 may be formed to have substantially the same width as the portion of the wavelength-converting layer 53 bound by the sixth surface 5331.

Figure 6:
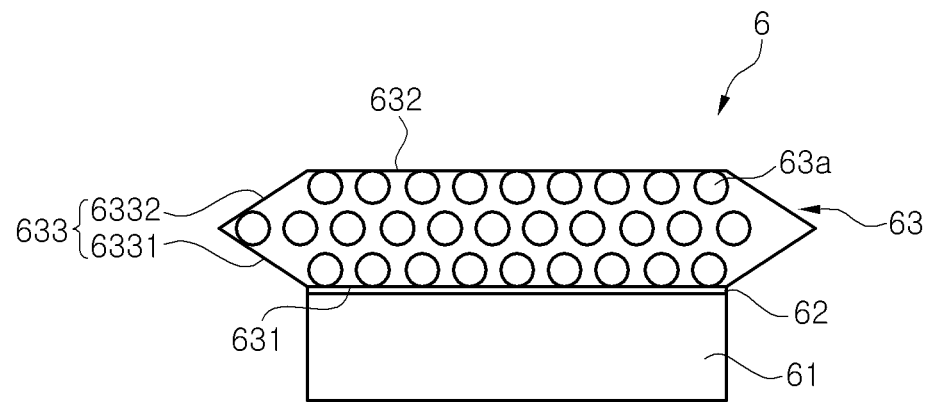

Meanwhile, a wavelength-converting layer 63 as shown in FIG. 6 includes a first surface 631 attached to an LED chip 61, a second surface 632 having substantially the same width as the first surface 631, and the wavelength-converting layer 63 bound by third surface 633 having a width gradually increasing and then gradually decreasing between the first surface 631 and the second surface 632. The third surface 633 includes a ninth surface 6331 having a predetermined slope to bound a portion of the wavelength-converting layer 63 having a width becoming gradually greater than the first surface 631 by a predetermined amount, and a tenth surface 6332 having a predetermined slope to bound a portion of the wavelength-converting layer 63 having a width becoming gradually smaller by a predetermined amount from the ninth surface 6331 and then being connected to the second surface 632. Here, the ninth surface 6331 and the tenth surface 6332 may be symmetrical with respect to a center point where the ninth surface 6331 meets the tenth surface 6332.

Additionally, the wavelength-converting layer may have any shape if it includes a first surface having the same width as the upper surface of the LED chip and at least one of a second surface and a third surface bounding a portion of the wavelength-converting layer partially having a width greater than the upper surface of the LED chip.

Referring to FIG. 1(*b*) again, the wavelength-converting layer 13 has a hole H formed at a portion where the wavelength-converting layer 13 is attached to the upper surface of the LED chip 11. The hole H may allow the bonding pad 111 of the LED chip 11 to be exposed.

The wire W is bonded to the bonding pad 111.

Figure 7:
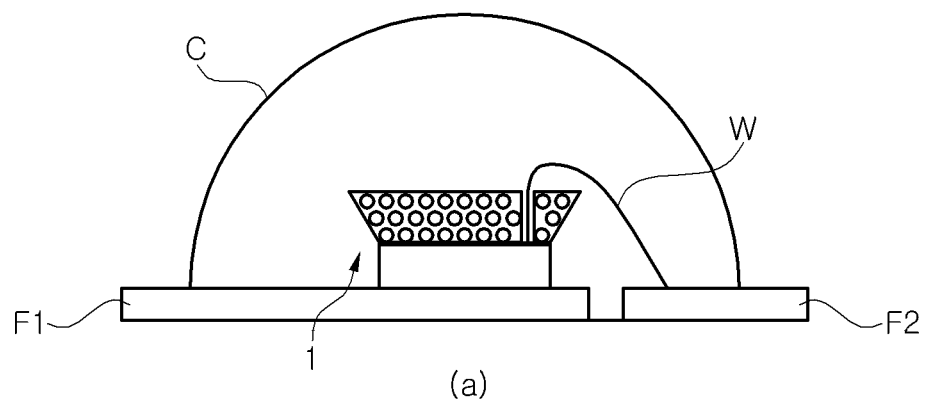
FIG. 7a and FIG. 7b show the light emitting element shown in FIG. 1 arranged on various mounting surfaces.
Figure 7:
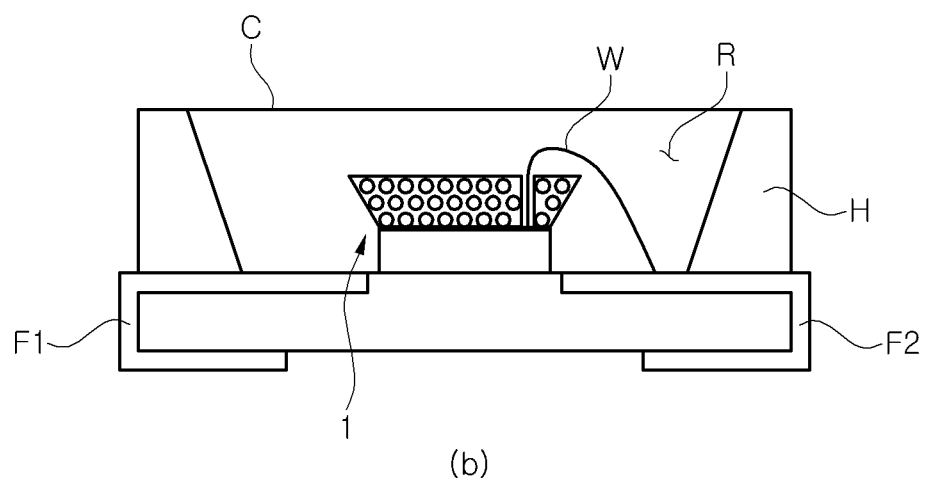

The light emitting element 1 so configured may be mounted to a mounting surface as shown in FIG. 7. The mounting surface may be any one of lead frames F1 and F2 spaced apart from each other as shown in FIG. 7(*a*), or a bottom surface of a cavity R with an exposed upper portion as shown in FIG. 7(*b*).

An encapsulant C with a convex shape may be formed to cover the light emitting element 1 as shown in FIG. 7(*a*), or an encapsulant C with a flat upper surface may be formed to fill the cavity R provided in a housing H that supports the lead frames F1 and F2 as shown in FIG. 7(*b*).

According to exemplary embodiments of the present invention, a wavelength-converting layer may be attached or arranged on an upper surface of an LED chip and may uniformly color-convert the light emitted from the LED chip. Accordingly, a wavelength-converting layer may be arranged or attached to the LED chip and reduce a color variation generated between light emitted from a vertical surface and a side of the LED chip. In a case where a wavelength-converting layer having a yellow phosphor is attached to an upper surface of the LED chip emitting blue light in order to realize white light, it may be possible to prevent occurrence of a blue ring that is generated when the blue light emitted from the LED chip does not pass through the wavelength-converting layer.

The present invention is not limited to the aforementioned exemplary embodiments, but those skilled in the art can make various modifications and changes thereto, which will be included in the spirit and scope of the present invention defined by the appended claims.

What is claimed is:

1. A light emitting element, comprising:
a light emitting diode (LED) chip having an upper surface; and
a wavelength-converting layer having a top surface, an opposing bottom surface, and sidewalls extending from the top surface to the bottom surface, the bottom surface being disposed on the upper surface of the LED chip, the wavelength-converting layer configured to convert a wavelength of light emitted from the LED chip, wherein,
a total area of the bottom surface is less than or equal to a total area of the upper surface,
a total area of a first horizontal cross-section of the wavelength-converting layer, taken between the top and bottom surfaces, is greater than a total area of the upper surface of the LED chip, and
the sidewalls comprise protrusions having a rectangular vertical cross-section, or the sidewalls protrude outwardly so as to have a V-shaped vertical cross-section.

2. The light emitting element of claim 1, wherein the top surface is curved or substantially parallel to the bottom surface.

3. The light emitting element of claim 1, wherein the total area of the top surface is equal to the total area of the bottom surface.

4. The light emitting element of claim 1, further comprising an adhesive material disposed between the wavelength-converting layer and the upper surface of the LED chip.

5. The light emitting element of claim 1, wherein the wavelength-converting layer comprises a hole exposing a bonding pad arranged on the upper surface of the LED chip.

6. The light emitting element of claim 5, further comprising a wire electrically connected to the bonding pad.

7. The light emitting element of claim 1, further comprising a first lead frame and a second lead frame spaced apart from each other and connected to the LED chip.

8. The light emitting element of claim 1, wherein the wavelength-converting layer is disposed entirely above a plane of the upper surface of the LED chip.

9. A light emitting element, comprising:
a light emitting diode (LED) chip having an upper surface; and
a wavelength-converting layer having a top surface, an opposing bottom surface, and sidewalls extending from the to surface to the bottom surface, the bottom surface being disposed on the upper surface of the LED chip, the wavelength-converting layer configured to convert a wavelength of light emitted from the LED chip, wherein,
a total area of the bottom surface is less than or equal to a total area of the upper surface,
a total area of a first horizontal cross-section of the wavelength-converting layer, taken between the top and bottom surfaces, is greater than a total area of the upper surface of the LED chip, and
a total area of a second horizontal cross-section of the wavelength-converting layer, taken between the first horizontal cross-section and the bottom surface, is equal to the total area of the bottom surface.

10. The light emitting element of claim 9, wherein a total area of a third horizontal cross-section of the wavelength-converting layer, taken between the first horizontal cross-section and the top surface, is equal to the total area of the bottom surface.

11. The light emitting element of claim 9, wherein a total area of a third horizontal cross-section of the wavelength-converting layer, taken between the first horizontal cross-section and the top surface, is greater than the total area of the first horizontal cross-section.

12. The light emitting element of claim 9, wherein a total area of a third horizontal cross-section of the wavelength-converting layer, taken between the first horizontal cross-section and the top surface, is equal to the total area of the first horizontal cross-section.

13. A light emitting element, comprising:
- a light emitting diode (LED) chip having an upper surface; and
- a wavelength-converting layer having a top surface, an opposing bottom surface, and sidewalls extending from the to surface to the bottom surface, the bottom surface being disposed on the upper surface of the LED chip, the wavelength-converting layer configured to convert a wavelength of light emitted from the LED chip, wherein,
- a total area of the bottom surface is less than or equal to a total area of the upper surface,
- a total area of a first horizontal cross-section of the wavelength-converting layer, taken between the top and bottom surfaces, is greater than a total area of the upper surface of the LED chip,
- a total area of a second horizontal cross-section of the wavelength-converting layer, taken between the first horizontal cross-section and the bottom surface, is greater than the total area of the bottom surface and is less than the total area of the first horizontal cross section, and;
- a total area of a third horizontal cross-section of the wavelength-converting layer, taken between the first horizontal cross-section and the top surface, is greater than the total area of the bottom surface and is less than the total area of the first horizontal cross section.

* * * * *